US008913374B2

(12) United States Patent
Wu et al.

(10) Patent No.: US 8,913,374 B2
(45) Date of Patent: Dec. 16, 2014

(54) PROTECTIVE COVER AND ELECTRONIC DEVICE THEREWITH

(71) Applicants: Hung-Yun Wu, Taipei (TW); Ho-Ching Huang, Taipei (TW); Wen-Cheng Tsai, Taipei (TW); I-Tien Hsieh, Taipei (TW)

(72) Inventors: Hung-Yun Wu, Taipei (TW); Ho-Ching Huang, Taipei (TW); Wen-Cheng Tsai, Taipei (TW); I-Tien Hsieh, Taipei (TW)

(73) Assignee: Pegatron Corporation, Beitou District, Taipei (TW)

( * ) Notice: Subject to any disclaimer, the term of this patent is extended or adjusted under 35 U.S.C. 154(b) by 301 days.

(21) Appl. No.: 13/666,924

(22) Filed: Nov. 1, 2012

(65) Prior Publication Data
US 2013/0107435 A1    May 2, 2013

(30) Foreign Application Priority Data
Nov. 2, 2011   (TW) .............................. 100139933 A

(51) Int. Cl.
*H05K 5/00* (2006.01)
*H05K 7/00* (2006.01)
*H05K 5/02* (2006.01)

(52) U.S. Cl.
CPC ............... *H05K 5/0217* (2013.01); *H05K 5/00* (2013.01); *H05K 5/0239* (2013.01)
USPC ..................... 361/679.01; 361/727

(58) Field of Classification Search
CPC ..... H05K 5/00; H05K 5/0217; H05K 5/0239; H05K 5/03; G01J 5/048; G03B 11/043
USPC ........... 361/679.01, 727; 312/293.3; 220/811, 220/345.5, 315, 324, 325, 812; 200/333; 206/781
See application file for complete search history.

(56) References Cited

U.S. PATENT DOCUMENTS

| 6,510,960 | B1* | 1/2003 | Christopherson et al. . 220/345.3 |
| 6,512,178 | B2* | 1/2003 | Goodman ........................ 174/66 |
| 7,651,346 | B2* | 1/2010 | Francis et al. ................ 439/136 |
| 7,950,859 | B2* | 5/2011 | Zhang et al. .................. 396/448 |
| 8,611,073 | B2* | 12/2013 | Murakata ................. 361/679.01 |
| 2008/0225471 | A1 | 9/2008 | Takizawa |
| 2012/0014047 | A1* | 1/2012 | Shibata et al. ........... 361/679.01 |
| 2012/0268871 | A1* | 10/2012 | Nishiwaki et al. ....... 361/679.01 |
| 2012/0275094 | A1* | 11/2012 | Zhou et al. ............... 361/679.01 |

FOREIGN PATENT DOCUMENTS

| CN | 201584571 U | 9/2010 |
| JP | 200773448 | 3/2007 |
| TW | 581378 | 3/2004 |
| TW | M292247 | 6/2006 |
| TW | M312169 | 5/2007 |
| TW | I331499 | 10/2010 |

* cited by examiner

*Primary Examiner* — Lisa Lea Edmonds
*Assistant Examiner* — Keith Depew
(74) *Attorney, Agent, or Firm* — Winston Hsu; Scott Margo

(57) ABSTRACT

A protective cover includes a base, a first member, and a second member. The base includes a sliding portion in an axis direction of the base. The first member includes a first sliding slot and a first fixing portion. The first fixing portion is fixed on a casing of an electronic device. The first sliding slot cooperates with the sliding portion to make the first member slide on the base in the axis direction between a position the first member overlapping the base and a position the first member being stretched out from the base, so as to adjust a length of the protecting cover. The second member is disposed on the base and includes a second fixing portion. The second fixing portion is used for being fixed on the casing.

10 Claims, 12 Drawing Sheets

PROTECTIVE COVER AND ELECTRONIC DEVICE THEREWITH

BACKGROUND

1. Technology Field

The present invention relates to a protective cover and an electronic device therewith, and more particularly, to a protective cover with an adjustable length and an electronic device therewith.

2. Description of the Prior Art

Generally speaking, a military or an industrial notebook computer is equipped with various antennas, such as a Wireless Local Area Network, WLAN, a Bluetooth and so on. A conventional design for preventing the antennas from collision and providing the antennas with a shielding free space arises as follows. First, a plurality of containing slots with different lengths corresponding to lengths of the antennas is formed on a casing of the notebook computers. Then, each of the antennas is installed inside the corresponding containing slot. Finally, a protective cover with an appropriate length is disposed on the corresponding containing slot for covering the corresponding containing slot, so as to cover the antenna inside the corresponding containing slot.

However, there are various antennas adapted to the military or the industrial notebook computer and different notebook computers have different requirements of the antenna. Accordingly, many protective covers with different lengths are manufactured to cover the containing slots with different sizes. As a result, many toolings are required for manufacturing the protective covers, resulting in great increase of manufacture cost.

SUMMARY

According to an embodiment of the present invention, a protective cover disposed on a casing of an electronic device for covering a containing slot on the casing is disclosed. The protective cover includes a base, a first member and a second member. The base includes a sliding portion in an axis direction of the base. The first member includes a first sliding slot and a first fixing portion. The first fixing portion is fixed on the casing. The first sliding slot cooperates with the sliding portion to make the first member slide on the base in the axis direction between a position the first member overlapping the base and a position the first member being stretched out from the base, so as to adjust a length of the protective cover. The second member is disposed on the base, and the second member includes a second fixing portion for being fixed on the casing.

According to another embodiment of the present invention, an electronic device includes a casing, an electronic component and a protective cover. A containing slot is formed on the casing, and the electronic component is disposed inside the containing slot. The protective cover is disposed on the casing for covering the containing slot, and the protective cover includes a base, a first member and a second member. The base includes a sliding portion in an axis direction of the base. The first member includes a first sliding slot and a first fixing portion. The first fixing portion is fixed on the casing. The first sliding slot cooperates with the sliding portion to make the first member slide on the base in the axis direction between a position the first member overlapping the base and a position the first member being stretched out from the base, so as to adjust a length of the protective cover. The second member is disposed on the base, and the second member includes a second fixing portion for being fixed on the casing.

In summary, the embodiment of the present invention utilizes the first sliding slot of the first member to cooperate with the sliding portion on the base, such that the first member can slide by utilizing the sliding portion on the base relative to the second member. Accordingly, a length of the protective cover can be adjusted within a range that the first member is capable of sliding relative to the second member. When the first member slides relative to the second member by a specific distance, the first fixing portion of the first member and the second fixing portion of the second member can be respectively fixed on the casing of the electronic computer, so as to fix the first member relative to the second member. In such a manner, the length of the protective cover is adjustable by relative sliding between the first member and the second member, so as to be adapted to the electronic components with different sizes and save manufacture cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
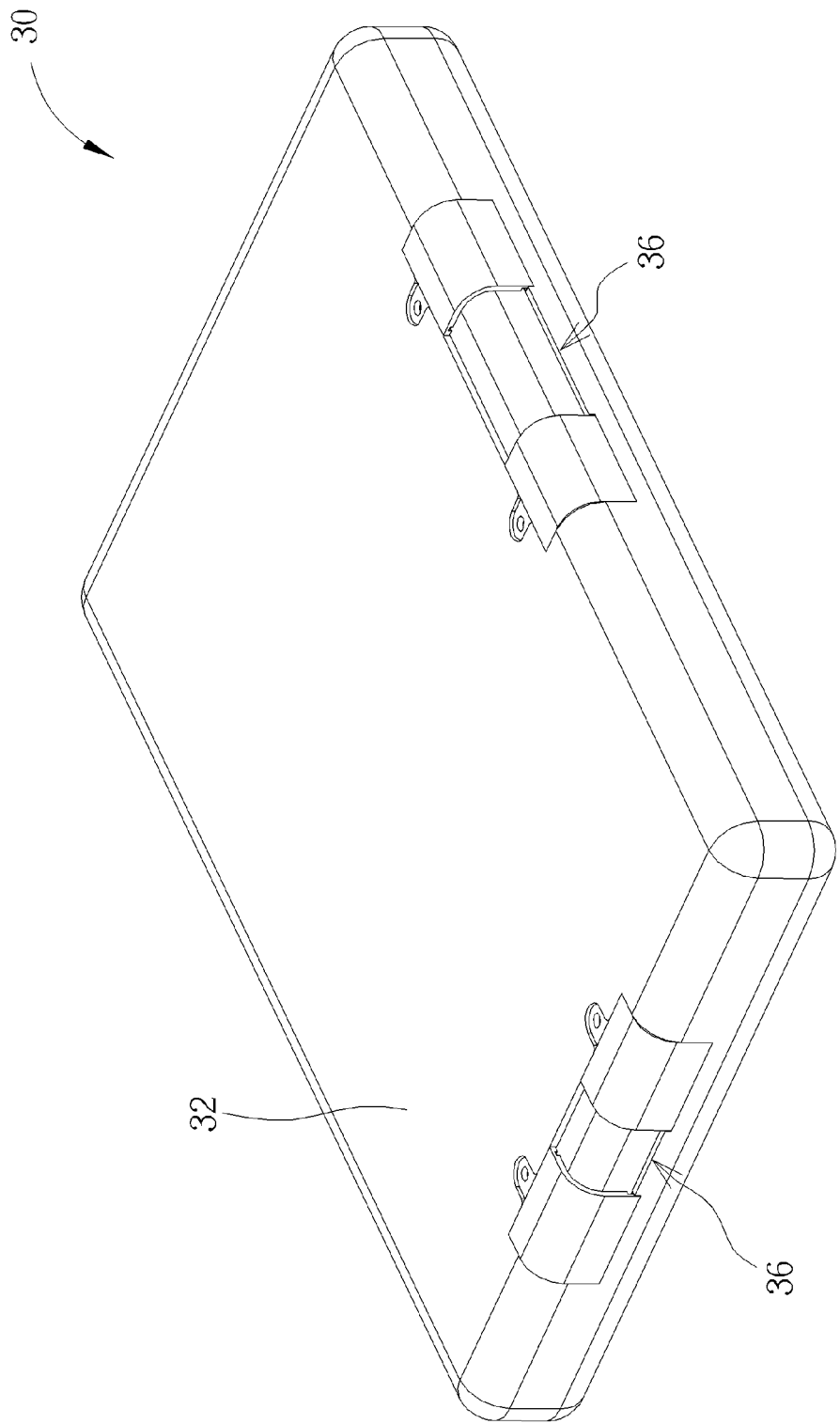
FIG. 1 is a diagram of an electronic device according to a first embodiment of the present invention.
Figure 2:
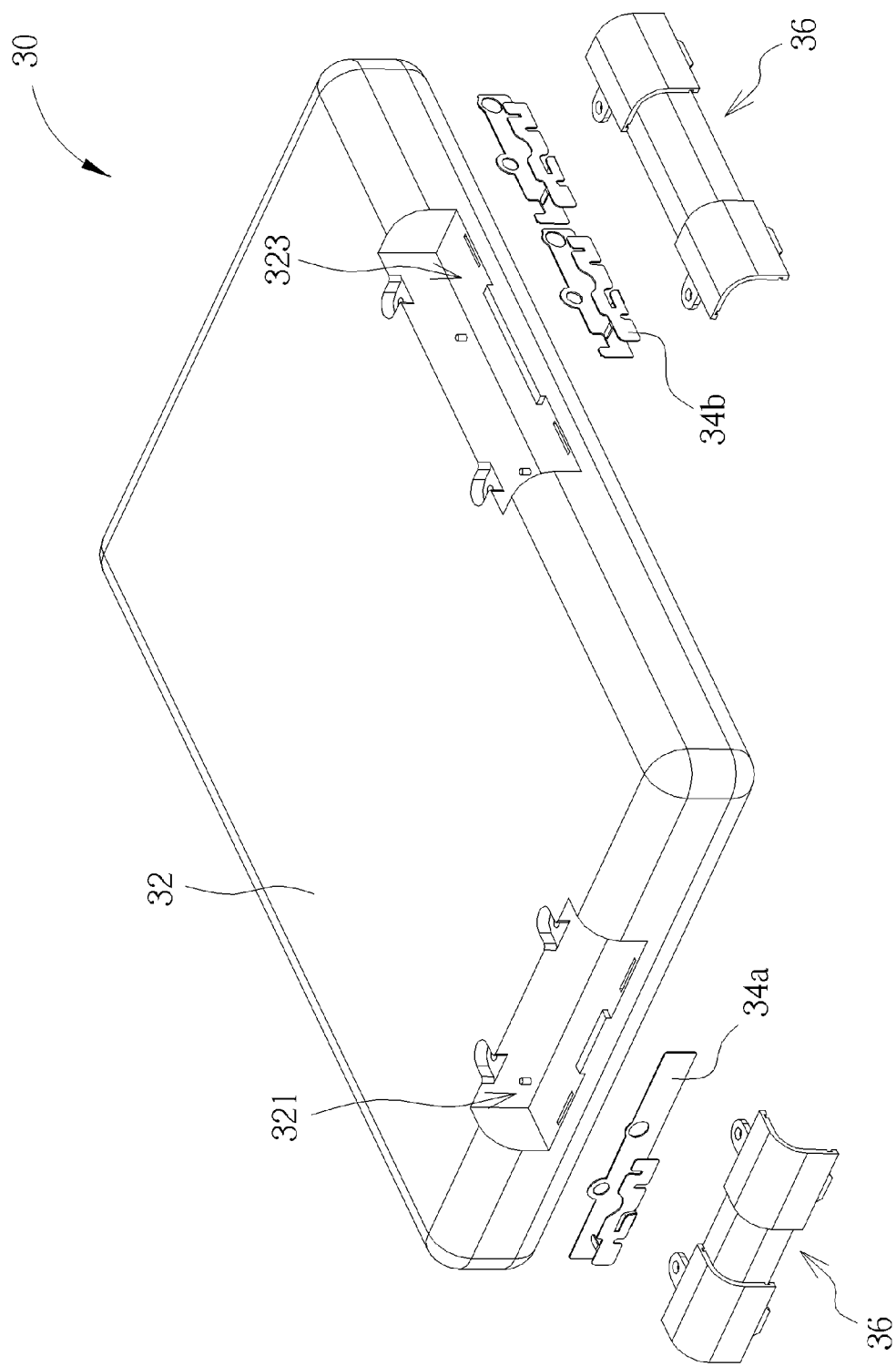
FIG. 2 is a partly exploded diagram of the electronic device according to the first embodiment of the present invention.

Please refer to FIG. 1 and FIG. 2. FIG. 1 is a diagram of an electronic device 30 according to a first embodiment of the present invention. FIG. 2 is a partly exploded diagram of the electronic device 30 according to the first embodiment of the present invention. As shown in FIG. 1 and FIG. 2, the electronic device 30 includes a casing 32, an electronic component 34a, 34b and at least one protective cover 36. In this embodiment, a length of the electronic component 34a is different from a length of the electronic component 34b. Furthermore, a length of the protective cover 36 is adjustable for being adapted to the electronic components 34a, 34b. An amount of the electronic components 34a, 34b and the protective cover 36 of the electronic device 30 is not limited to those mentioned in this embodiment, and it depends on practical demands. In this embodiment, the electronic device 30 is preferably a military or an industrial notebook computer, and the electronic component 34a, 34b is preferably a military or an industrial antenna, such as a Wireless Local Area Network, WLAN, antenna, a Bluetooth antenna and so on.

Furthermore, a first containing slot 321 and a second containing slot 323 are formed on the casing 32. In this embodiment, a length of the first containing slot 321 is different from a length of the second containing slot 323, and the first containing slot 321 and the second containing slot 323 are respectively used for containing the electronic components 34a, 34b. In practical application, the first containing slot 321 and the second containing slot 323 on the casing 32 can be respectively covered by the protective cover 36 for protecting the aforesaid electronic components 34a, 34b. In such a manner, the protective cover 36 of the present invention can cover the first containing slot 321 and the second containing slot 323 when the electronic components 34a, 34b are disposed inside the first containing slot 321 and the second containing slot 323 on the casing 32, so as to protect the electronic components 34a, 34b from collision. On the other hand, since the protective cover 36 is made of plastic materials, it allows electromagnetic waves generated by the electronic components 34a, 34b to pass, resulting in that communication between the electronic components 34a, 34b and an external electronic component is not shielded by the protective cover 36. In summary, the protective cover 36 of the present invention not only protects the electronic components 34a, 34b from collision, but also allows the electronic components 34a, 34b covered by the protective cover 36 to communicate with the external electronic component.

Figure 3:
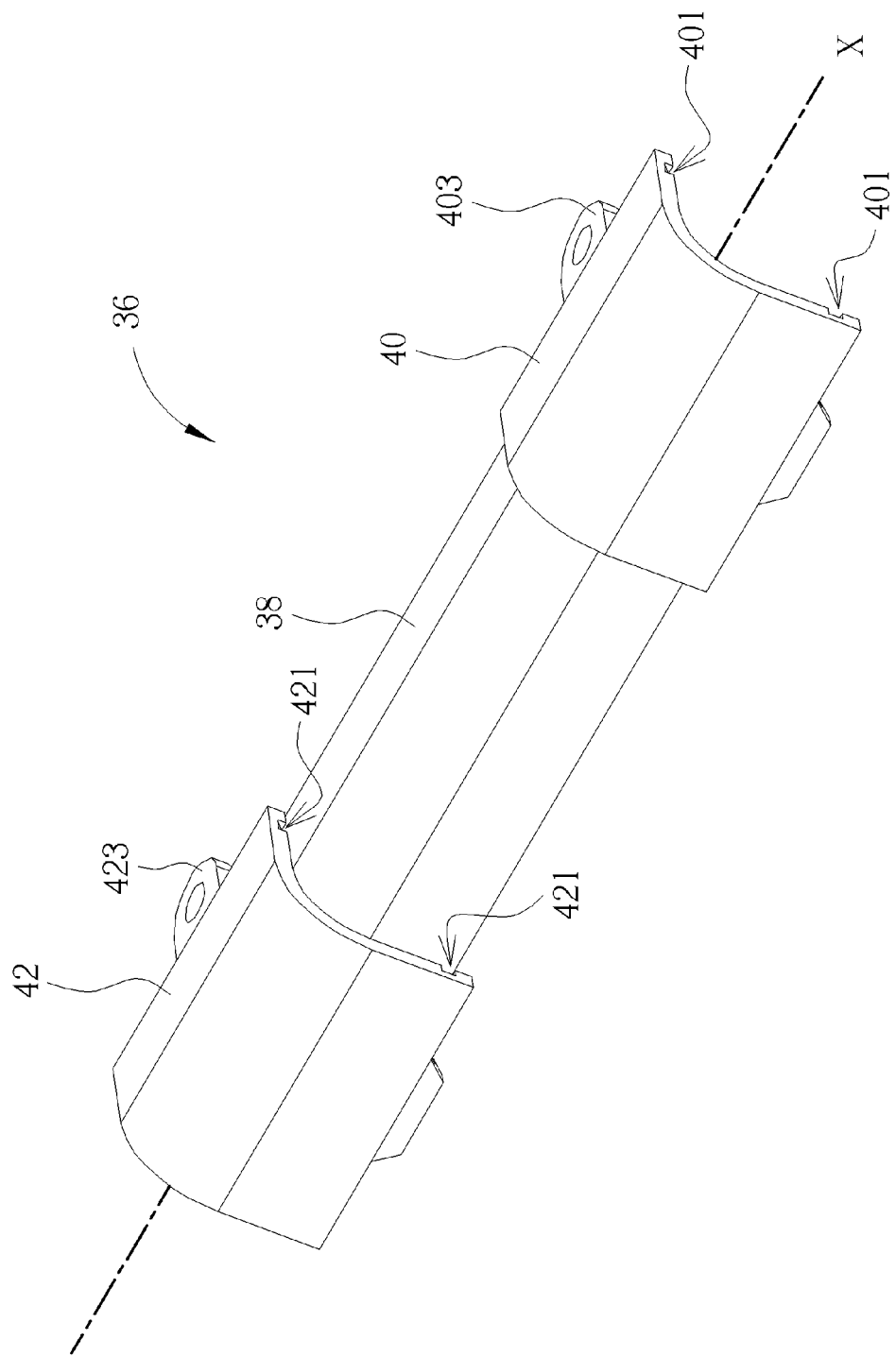
FIG. 3 is a diagram of a protective cover according to the first embodiment of the present invention.
Figure 4:
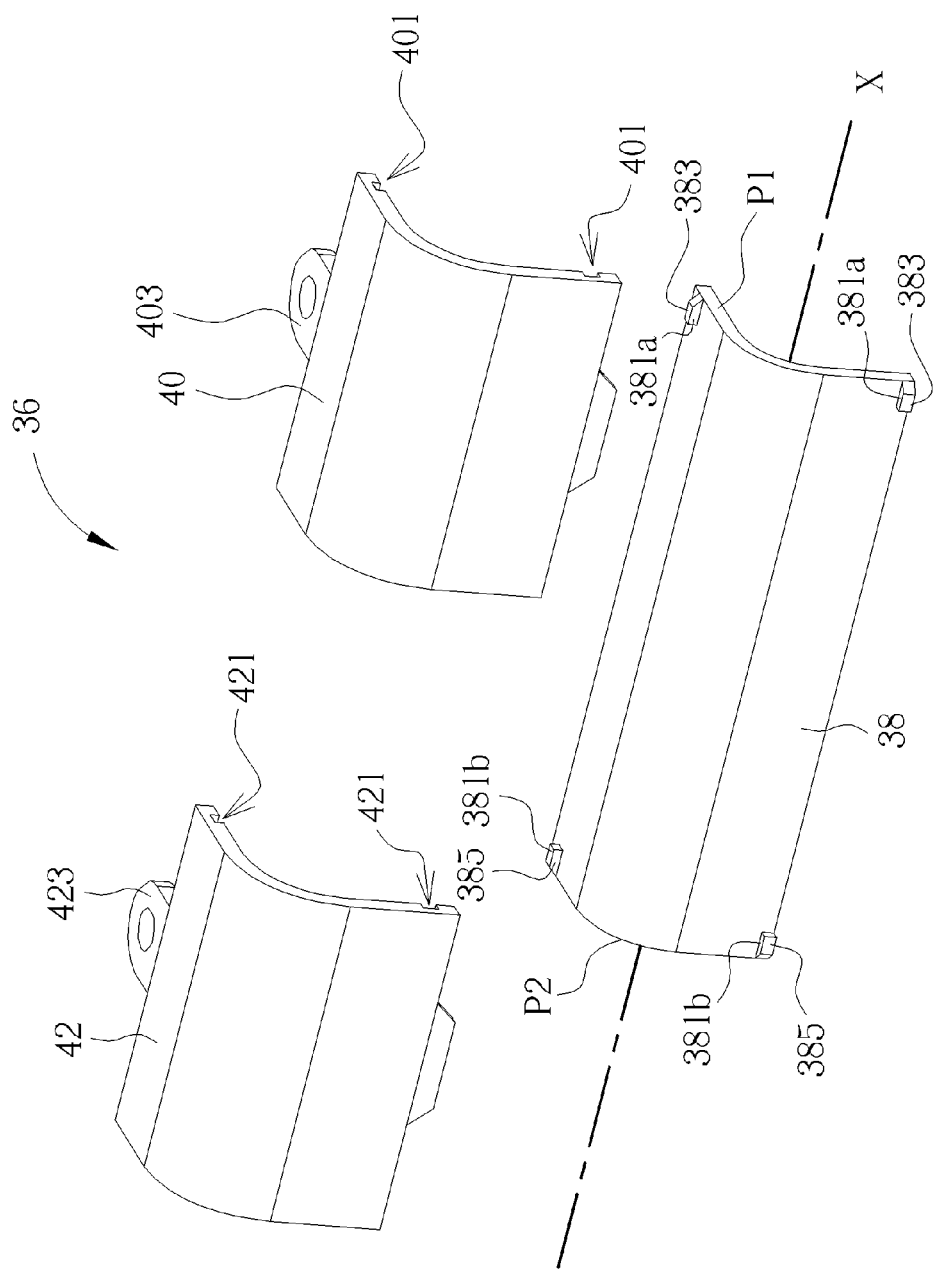
FIG. 4 is an exploded diagram of the protective cover according to the first embodiment of the present invention.
Figure 5:
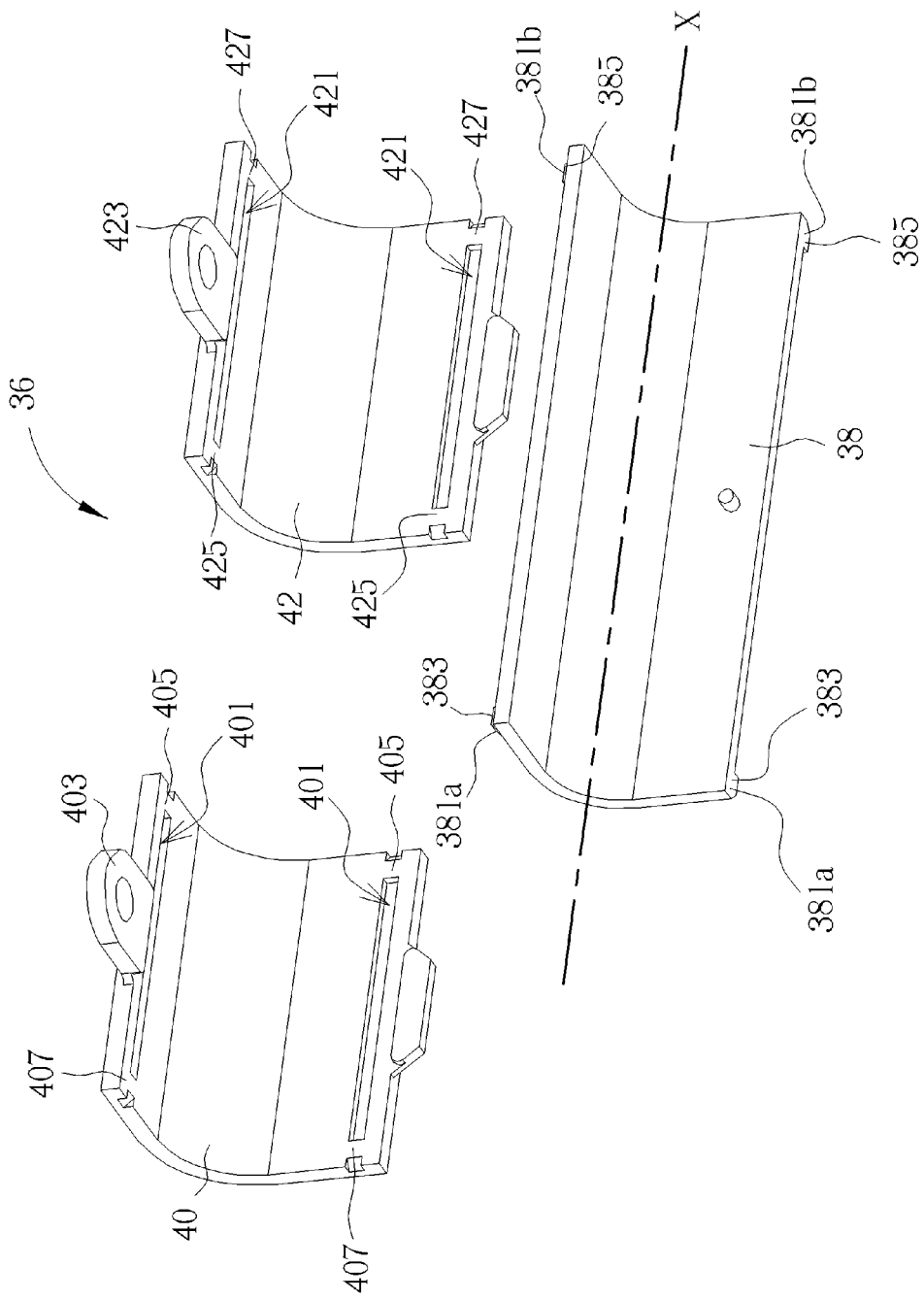
FIG. 5 is an exploded diagram of the protective cover in FIG. 4 in another view.

Please refer to FIG. 3 to FIG. 5. FIG. 3 is a diagram of the protective cover 36 according to the first embodiment of the present invention. FIG. 4 is an exploded diagram of the protective cover 36 according to the first embodiment of the present invention. FIG. 5 is an exploded diagram of the protective cover 36 in FIG. 4 in another view. As shown in FIG. 3 to FIG. 5, the protective cover 36 includes a base 38, a first member 40 and a second member 42. At least one sliding portion is formed on the base 38 in an axis direction X. In this embodiment, two sets of the sliding portions 381a, 381b are formed on the base 38, and each set of the sliding portions 381a, 381b is respectively formed on two opposite end portions P1, P2 of the base 38. Additionally, the first member 40 includes a first sliding slot 401, and the second member 42 includes a second sliding slot 421. The first sliding slot 401 of the first member 40 cooperates with the sliding portion 381a on the base 38, such that the first member 40 can slide in the axis direction X by the sliding portion 381a on the base 38. Similarly, the second sliding slot 421 of the second member 42 cooperates with the sliding portion 381b on the base 38, such that the second member 42 can slide in the axis direction X by the sliding portion 381a on the base 38. In such a manner, the first member 40 can slide on the base 38 relative to the second member 42 between a position the first member 40 overlapping the base 38 and a position the first member 40 being stretched out from the base 38, so as to adjust the length of the protective cover 36.

In this embodiment, a shape of the first member 40 is substantially identical to a shape of the second member 42. When the first member 40 and the second member 42 are installed, the sliding portion 381a on the base 38 is disposed inside the first sliding slot 401 of the first member 40 first, and then the sliding portion 381b on the base 38 is disposed inside the second sliding slot 421 of the second member 42. In such a manner, since the sliding portions 381a, 381b are respectively located on the two opposite end portions P1, P2 of the base 38, the first member 40 and the second member 42 can be installed on two opposite sides of the base 38. In other words, the first member 40 and the second member 42 are symmetrically disposed on the base 38, and the first member 40 is capable of sliding on the base 38 relative to the second member 42. In this embodiment, the sliding portions 381a, 381b can be, but not limited to, respectively a sliding track. For example, the sliding portions 381a, 381b can be respectively a protruding structure as well. In other words, structures allowing the sliding portions 381a, 381b to be respectively slidably disposed inside the first sliding slot 401 of the first member 40 and the second sliding slot 421 of the second member 42 are within the scope of the present invention.

Figure 6:
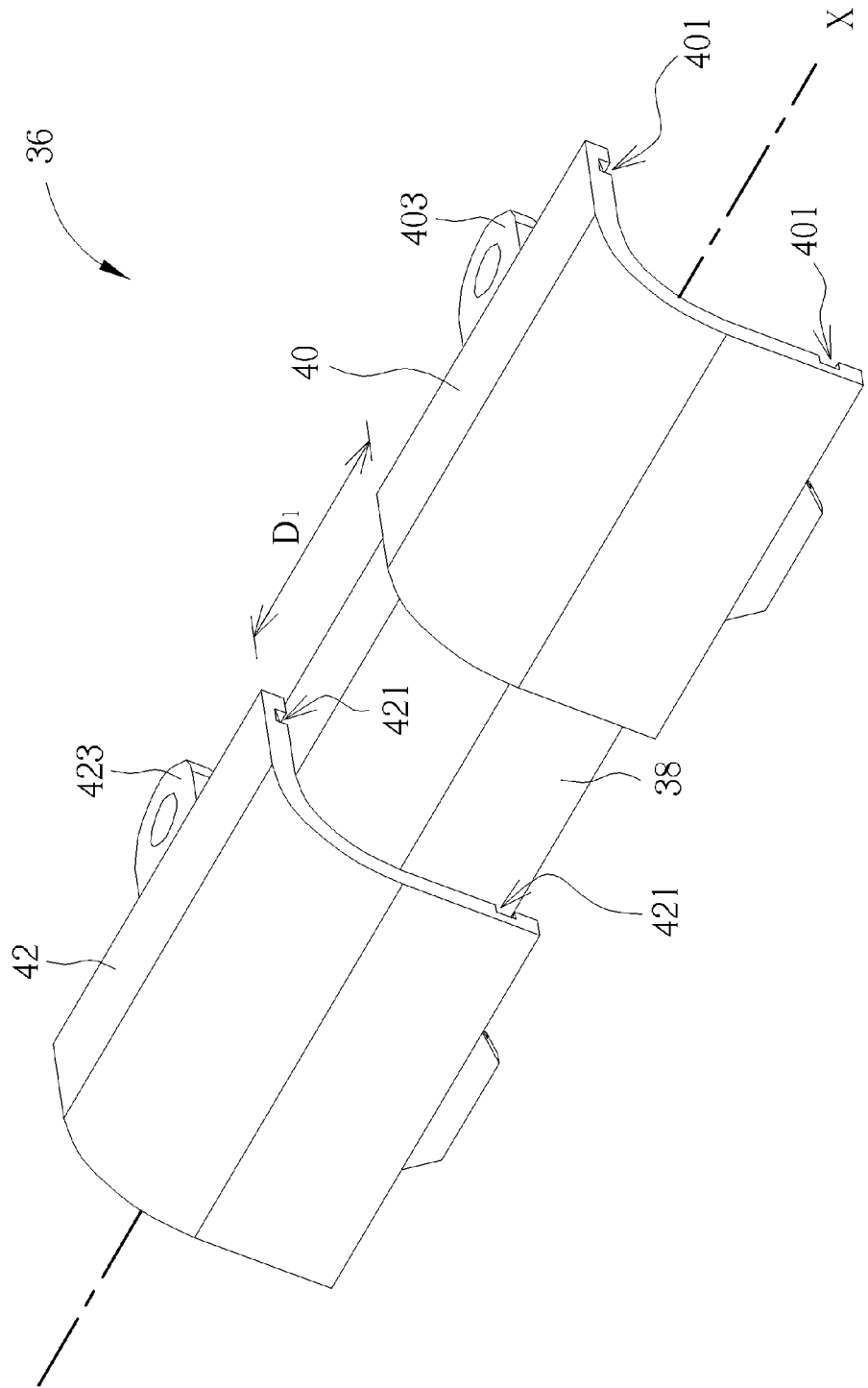
FIG. 6 is a diagram illustrating that a first member of the protective cover is apart from a second member by a first distance according to the first embodiment of the present invention.
Figure 7:
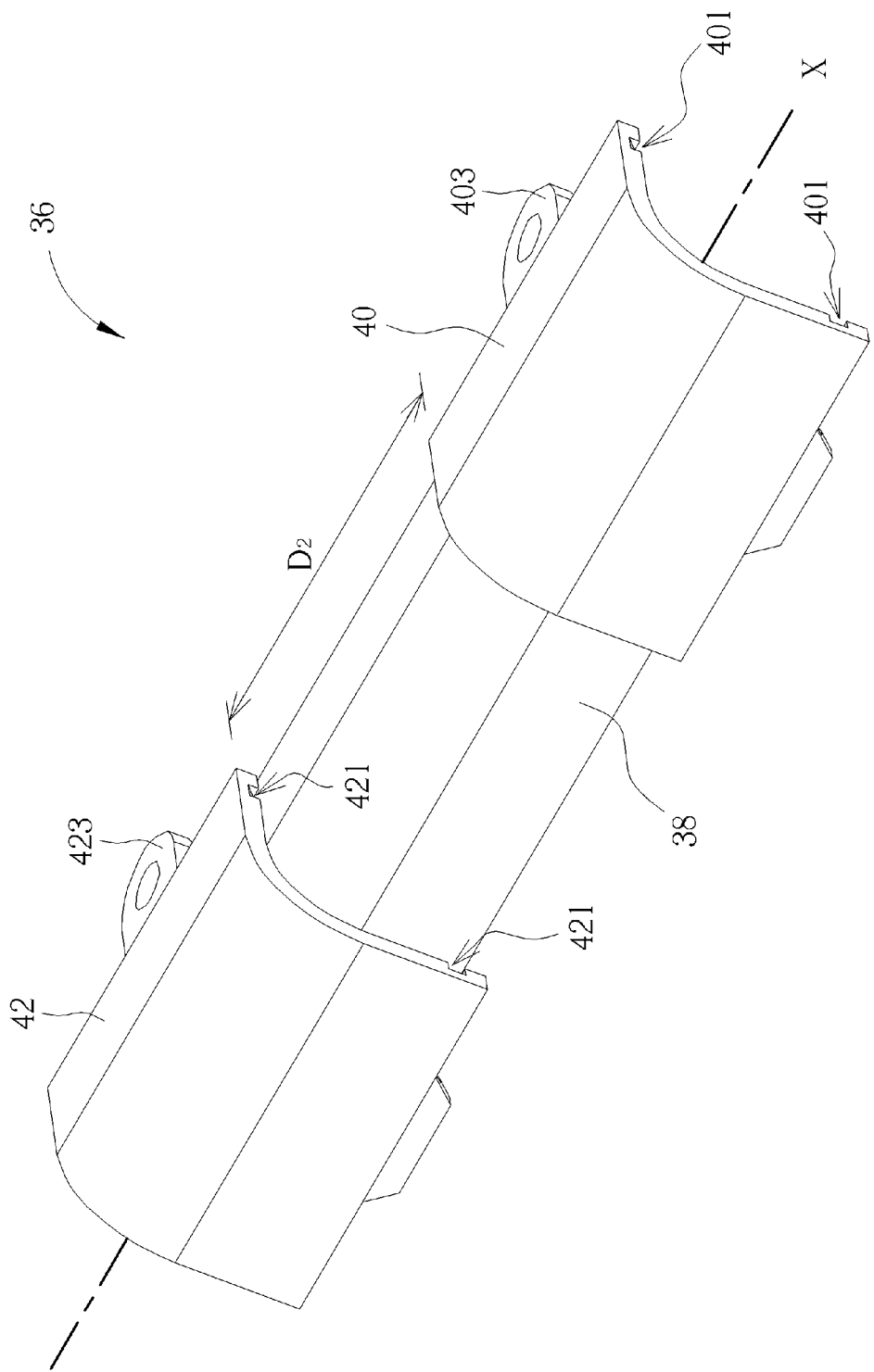
FIG. 7 is a diagram illustrating that the first member of the protective cover is apart from the second member by a second distance according to the first embodiment of the present invention.

In addition, the first member 40 of the protective cover 36 further includes a first fixing portion 403, and the second member 42 of the protective cover 36 further includes a second fixing portion 423. Both of the first fixing portion 403 and the second fixing portion 423 are used for being fixed on the casing 32. Please refer to FIG. 6 and FIG. 7. FIG. 6 is a diagram illustrating that the first member 40 of the protective cover 36 is apart from the second member 42 by a first distance D1 according to the first embodiment of the present invention. FIG. 7 is a diagram illustrating that the first member 40 of the protective cover 36 is apart from the second member 42 by a second distance D2 according to the first embodiment of the present invention. When the protective cover 36 is used for covering the first containing slot 321 to protect the electronic component 34a inside the first containing slot 321, at first, the first member 40 is slid on the base 38 relative to the second member 42 by the first distance D1 to make the length of the protective cover 36 be substantially equal to the length of the first containing slot 321. Then, the protective cover 36 is covered on the first containing slot 321. Finally, the first fixing portion 403 of the first member 40 and the second fixing portion 423 of the second member 42 are fixed on the casing 32 of the electronic device 30, respectively, so as to fix the protective cover 36 on the casing 32 of the electronic device 30. Furthermore, since the length of the protective cover 36 is equal to the length of the first containing slot 321, the protective cover 36 can completely cover the first containing slot 321 for protecting the electronic component 34a inside the first containing slot 321 from collision.

On the other hand, when the protective cover 36 is used for covering the second containing slot 323 to protect the electronic component 34b inside the second containing slot 323, at first, the first member 40 is slid on the base 38 relative to the second member 42 by the second distance D2 to make the length of the protective cover 36 be substantially equal to the length of the first containing slot 321. Then, the protective cover 36 is covered on the second containing slot 323. Finally, the first fixing portion 403 of the first member 40 and the second fixing portion 423 of the second member 42 are fixed on the casing 32 of the electronic device 30, respectively, so as to fix the protective cover 36 on the casing 32 of the electronic device 30. Furthermore, since the length of the protective cover 36 is equal to the length of the second containing slot 323, the protective cover 36 can completely cover the second containing slot 323 for protecting the electronic component 34b inside the second containing slot 323 from collision.

Figure 8:
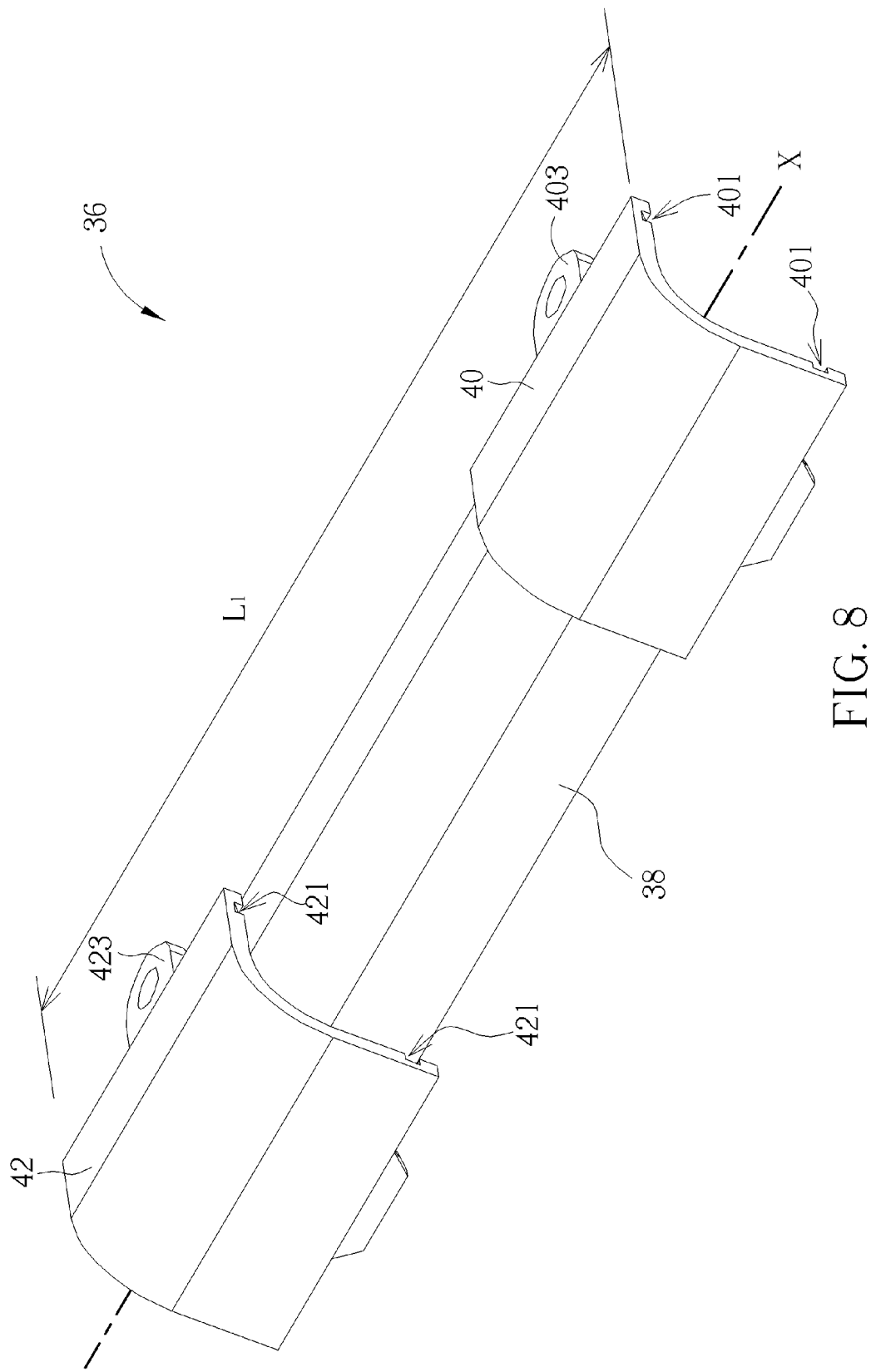
FIG. 8 is a diagram of the protective cover with a maximum length according to the first embodiment of the present invention.
Figure 9:
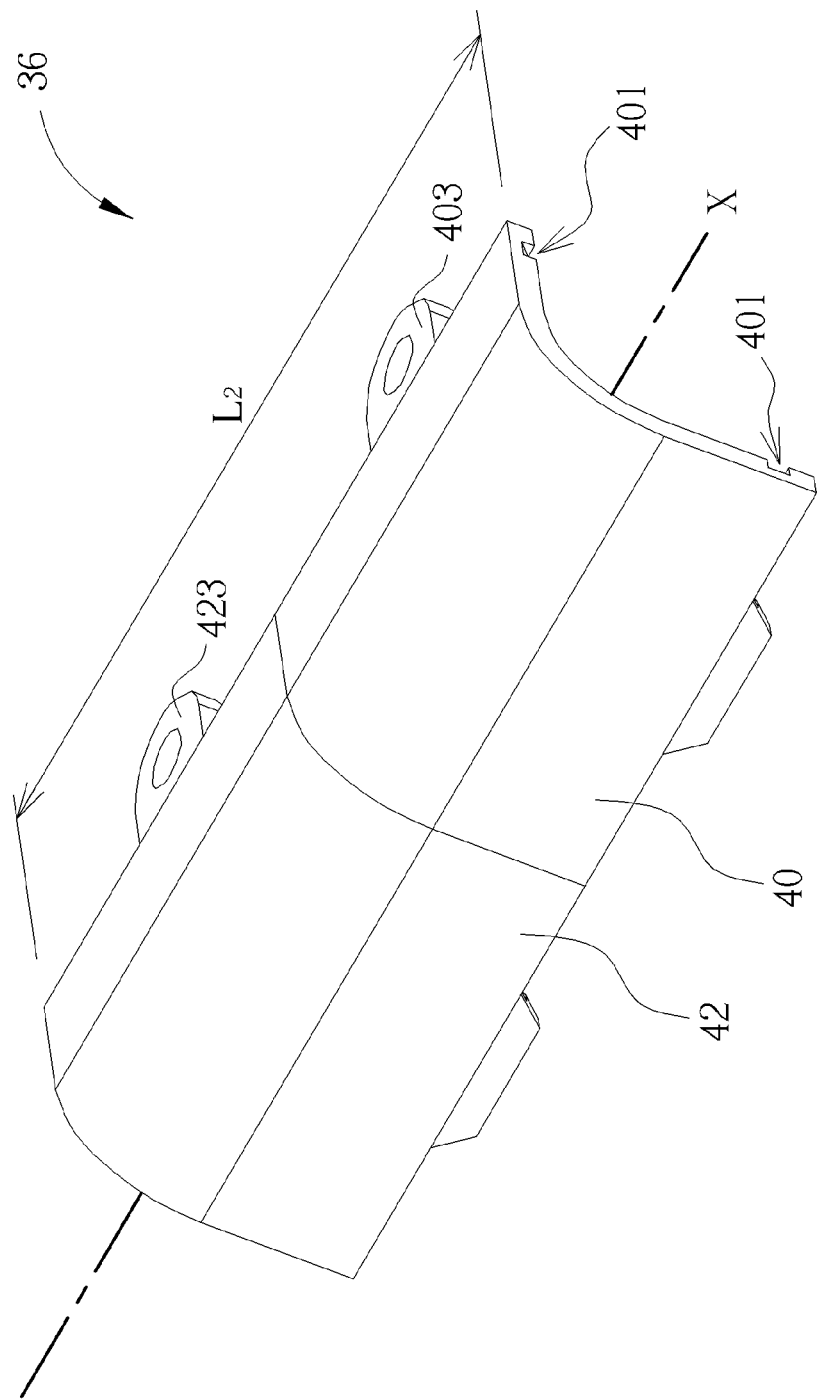
FIG. 9 is a diagram of the protective cover with a minimum length according to the first embodiment of the present invention.

Please refer to FIG. 4, FIG. 5, FIG. 8 and FIG. 9. FIG. 8 is a diagram of the protective cover 36 with a maximum length L1 according to the first embodiment of the present invention. FIG. 9 is a diagram of the protective cover 36 with a minimum length L2 according to the first embodiment of the present invention. As shown in figures, the base 38 includes a first stopping portion 383 and a second stopping portion 385. In this embodiment, the first stopping portion 383 and the second stopping portion 385 are, as shown in FIG. 4, integrally formed on the sliding portions 381a, 381b, respectively. The first member 40 further includes a third stopping portion 405 and a fourth stopping portion 407, and the third stopping portion 405 and the fourth stopping portion 407 are respectively formed on two ends of the first sliding slot 401, as shown in FIG. 5. Additionally, the second member 42 further includes a fifth stopping portion 425 and a sixth stopping portion 427, and the fifth stopping portion 425 and the sixth stopping portion 427 are respectively formed on two ends of the second sliding slot 421, as shown in FIG. 5. The first stopping portion 383 of the base 38 is used for stopping the third stopping portion 405 or the fourth stopping portion 407 of the first member 40, so as to constrain a distance the first member 40 sliding on the base 38. The second stopping portion 385 of the base 38 is used for stopping the fifth stopping portion 425 or the sixth stopping portion 427 of the second member 42, so as to constrain a distance the second member 42 sliding on the base 38.

As mentioned above, when the first member 40 slides on the base 38 to a position where the first stopping portion 383 of the base 38 stops the third stopping portion 405 of the first member 40 and when the second member 42 slides on the base 38 to a position where the second stopping portion 385 of the base 38 stops the fifth stopping portion 425 of the second member 42, a distance the second member sliding on the base 38 relative to the first member 40 is substantially equal to the length of the base 38. In such a manner, the protective cover 36 can have the maximum length L1, as shown in FIG. 8. On the other hand, when the first member 40 slides on the base 38 to a position where the first stopping portion 383 of the base 38 stops the fourth stopping portion 407 of the first member 40 and when the second member 42 slides on the base 38 to a position where the second stopping portion 385 of the base 38 stops the sixth stopping portion 427 of the second member 42, a distance the second member 42 sliding on the base 38 relative to the first member 40 is substantially equal to zero. In such a manner, the protective cover 36 can have the minimum length L2, as shown in FIG. 9.

Figure 10:
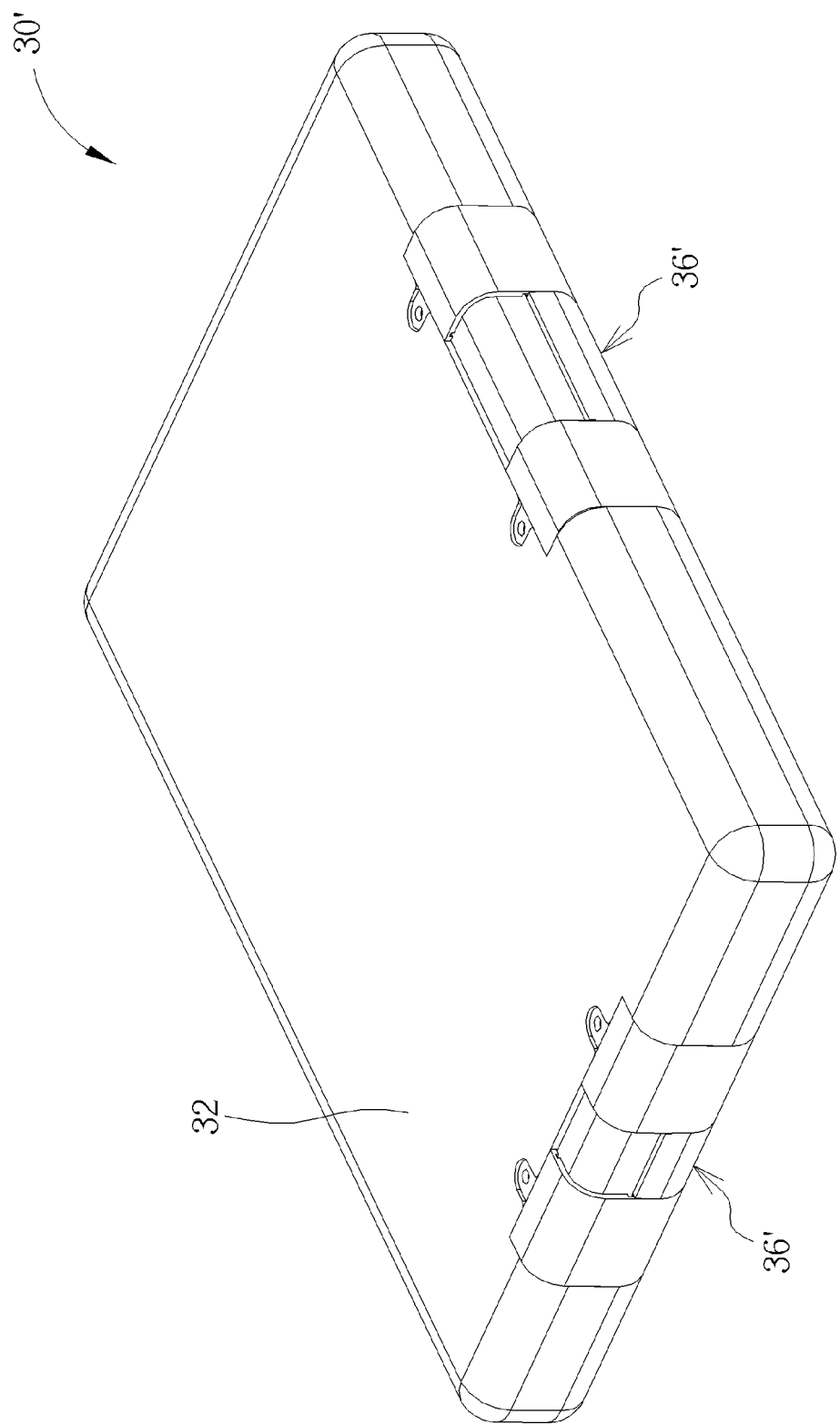
FIG. 10 is a diagram of an electronic device according to a second embodiment of the present invention.

Please refer to FIG. 1 and FIG. 10. FIG. 10 is a diagram of an electronic device 30' according to a second embodiment of the present invention. As shown in FIG. 10 and FIG. 1, a main difference between the electronic device 30' and the aforesaid electronic device 30 is that the protective cover 36 of the electronic device 30 is disposed on a corner of the casing 32, resulting in that the base 38, the first member 40 and the second member 42 of the protective cover 36 are respectively a substantially L-shaped structure, while a protective cover 36' of the electronic device 30' is disposed on a side of the casing 32, resulting in that the base, the first member and the second member of the protective cover 36' are respectively a substantially U-shaped structure.

Figure 11:
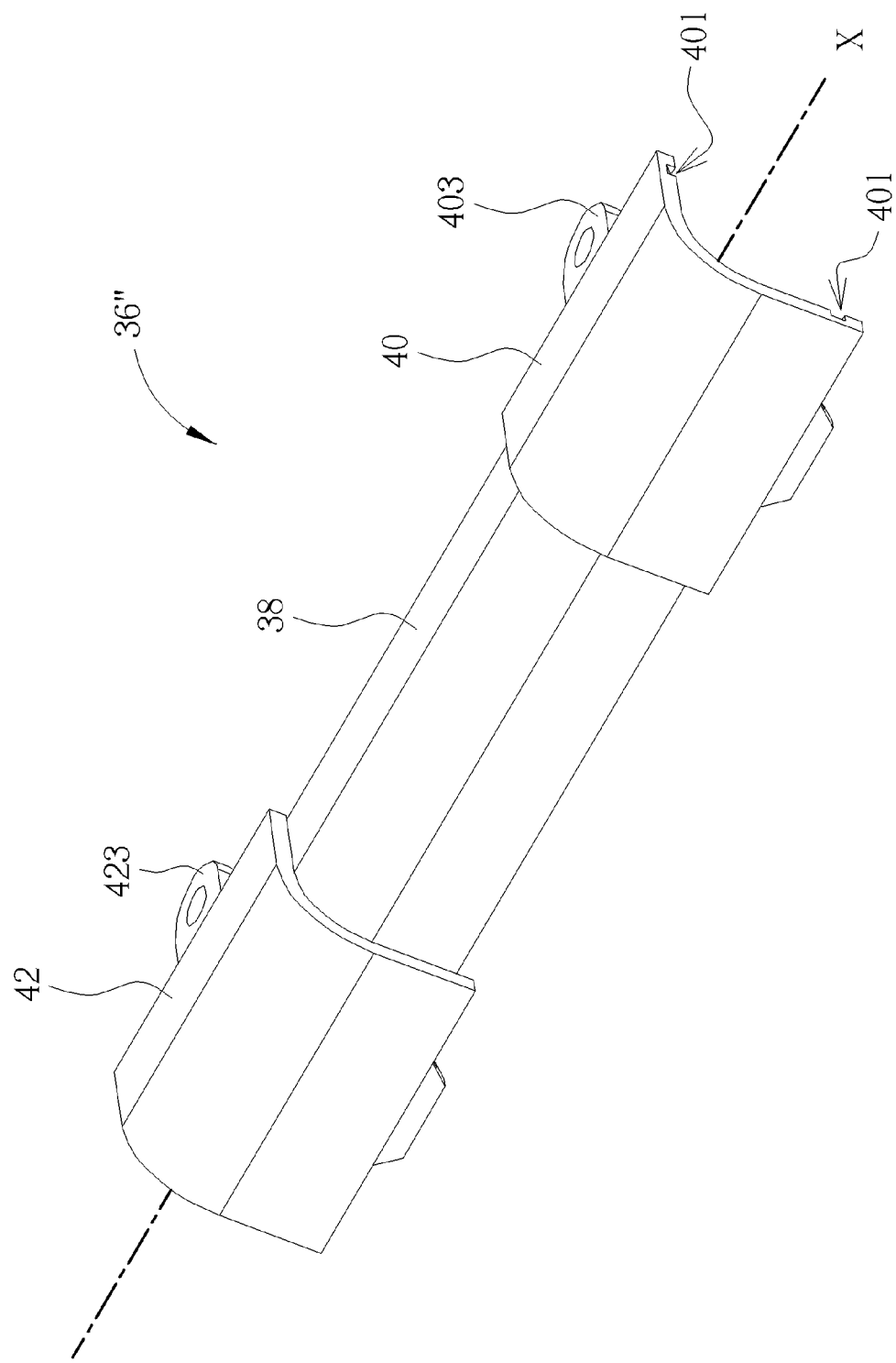
FIG. 11 is a diagram of a protective cover according to a third embodiment of the present invention.
Figure 12:
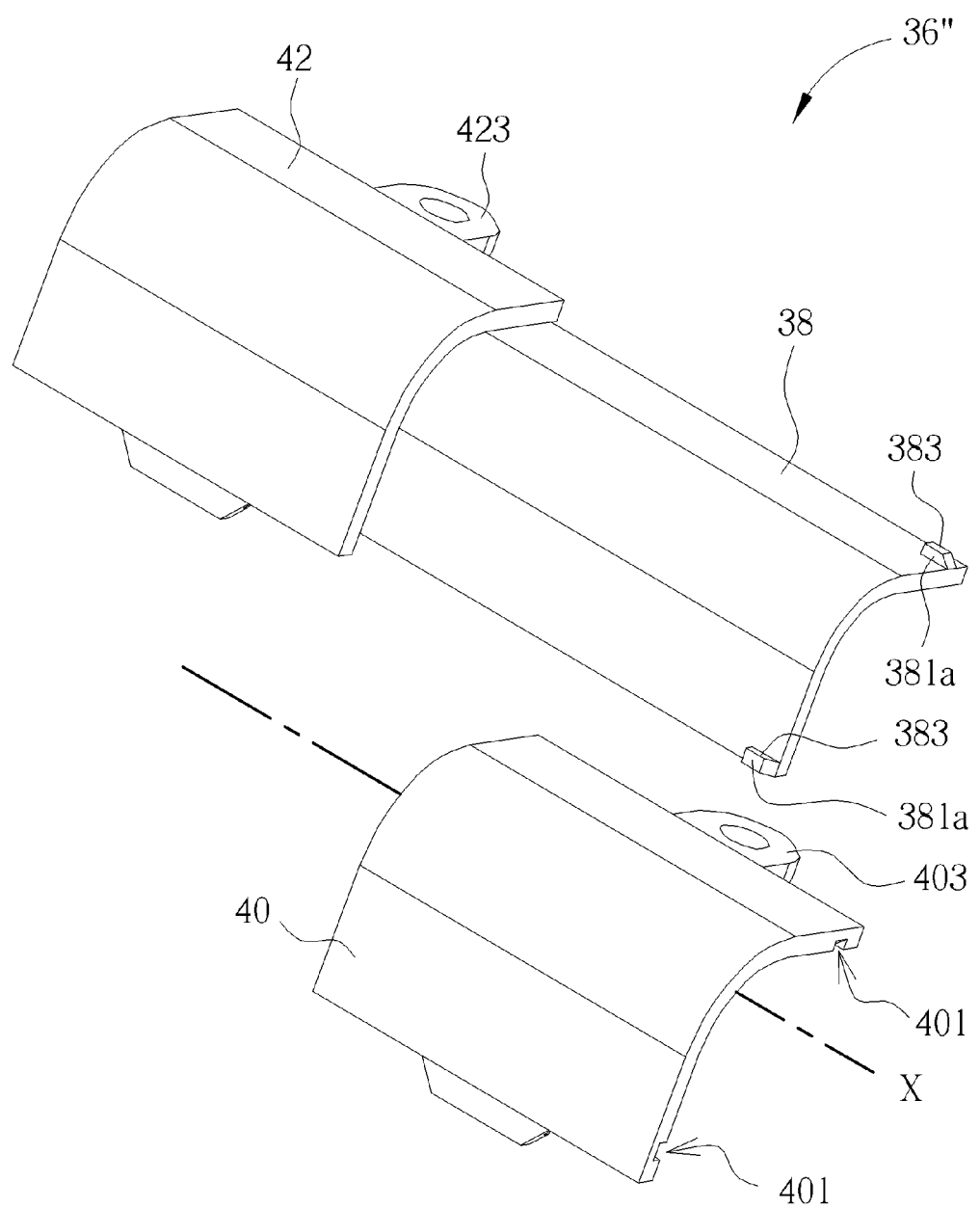
FIG. 12 is an exploded diagram of the protective cover according to the third embodiment of the present invention.

The base 38, the first member 40 and the second member 42 of the protective cover 36 in the first embodiment of the present invention are three separate components. Please refer to FIG. 3, FIG. 4, FIG. 11 and FIG. 12. FIG. 11 is a diagram of a protective cover 36" according to a third embodiment of the present invention. FIG. 12 is an exploded diagram of the protective cover 36" according to the third embodiment of the present invention. As shown in FIG. 3, FIG. 4, FIG. 11 and FIG. 12, a main difference between the protective cover 36" and the aforesaid protective cover 36 is that the second member 42 and the base 38 of the protective cover 36" are integrally formed, i.e. the base 38, the second member 42 and the first member 40 of the protective cover 36" are two separate components. In addition, the first member 40 is capable of sliding relative to the second member 42 by cooperation of the sliding slot and the sliding track, fixing of the fixing portions and stopping of the stopping portions. Accordingly, the protective cover 36" can be adapted to cover the first containing slot 321 and the second containing slot 323 on the casing 32 of the electronic device 30 by different sliding distances. Components in FIG. 3, FIG. 4, FIG. 11 and FIG. 12 with the same denotes have the same structures and functions, and further descriptions are omitted herein for simplicity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A protective cover disposed on a casing of an electronic device for covering a containing slot on the casing, the protective cover comprising:
a base comprising a sliding portion in an axis direction of the base;
a first member comprising a first sliding slot and a first fixing portion, the first fixing portion being fixed on the casing, the first sliding slot cooperating with the sliding portion to make the first member slide on the base in the axis direction between a position the first member overlapping the base and a position the first member being stretched out from the base, so as to adjust a length of the protective cover; and
a second member disposed on the base, the second member comprising a second fixing portion for being fixed on the casing.

2. The protective cover of claim 1, wherein the second member further comprises a second sliding slot, and the second sliding slot cooperates with the sliding portion, such that the second member slides on the base in the axis direction between a position the second member overlapping the base and a position the second member being stretched out from the base, so as to adjust the length of the protective cover.

3. The protective cover of claim 2, wherein the base comprises a first stopping portion and a second stopping portion, the first member further comprises a third stopping portion and a fourth stopping portion, the second member further comprises a fifth stopping portion and a sixth stopping portion, the first stopping portion stops the third stopping portion or the fourth stopping portion when the first member slides on the base, so as to constrain a distance the first member sliding on the base, and the second stopping portion stops the fifth stopping portion or the sixth stopping portion when the second member slides on the base, so as to constrain a distance the second member sliding on the base.

4. The protective cover of claim 2, wherein the second member and the first member are symmetrically disposed on the base.

5. The protective cover of claim 1, wherein the second member and the base are integrally formed.

6. The protective cover of claim 1, wherein the first member slides relative to the second member by a specific distance, the length of the protective cover is maximum when the specific distance is substantially equal to a length of the base, and the length of the protective cover is minimum when the specific distance is substantially equal to zero.

7. The protective cover of claim 1, wherein the sliding portion is a sliding track.

8. The protective cover of claim 1, wherein the base, the first member and the second member are a substantially L-shaped structure or a substantially U-shaped structure, respectively.

9. An electronic device, comprising:
- a casing whereon a containing slot is formed;
- an electronic component disposed inside the containing slot; and
- a protective cover disposed on the casing for covering the containing slot, the protective cover comprising:
    - a base comprising a sliding portion in an axis direction of the base;
    - a first member comprising a first sliding slot and a first fixing portion, the first fixing portion being fixed on the casing, the first sliding slot cooperating with the sliding portion to make the first member slide on the base in the axis direction between a position the first member overlapping the base and a position the first member being stretched out from the base, so as to adjust a length of the protective cover; and
    - a second member disposed on the base, the second member comprising a second fixing portion for being fixed on the casing.

10. The electronic device of claim 9, wherein the electronic component is an antenna.

\* \* \* \* \*